United States Patent
Chen et al.

(10) Patent No.: US 12,176,377 B2
(45) Date of Patent: Dec. 24, 2024

(54) CHIP STRUCTURE AND MANUFACTURING METHOD THEREFOR, DISPLAY APPARATUS

(71) Applicant: BOE Technology Group Co., Ltd., Beijing (CN)

(72) Inventors: Liang Chen, Beijing (CN); Haoliang Zheng, Beijing (CN); Hao Chen, Beijing (CN); Minghua Xuan, Beijing (CN); Dongni Liu, Beijing (CN); Jiao Zhao, Beijing (CN); Qi Qi, Beijing (CN); Li Xiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 288 days.

(21) Appl. No.: 17/772,951

(22) PCT Filed: Jun. 24, 2021

(86) PCT No.: PCT/CN2021/102071
§ 371 (c)(1),
(2) Date: Apr. 28, 2022

(87) PCT Pub. No.: WO2021/259356
PCT Pub. Date: Dec. 30, 2021

(65) Prior Publication Data
US 2023/0028984 A1    Jan. 26, 2023

(30) Foreign Application Priority Data
Jun. 24, 2020  (CN) .......................... 202010587826.8

(51) Int. Cl.
*H01L 27/15* (2006.01)
*H01L 25/18* (2023.01)

(52) U.S. Cl.
CPC .............. *H01L 27/15* (2013.01); *H01L 25/18* (2013.01)

(58) Field of Classification Search
CPC ......... H01L 27/15; H01L 25/18; H01L 33/42; H01L 33/62; H01L 25/167; H01L 27/156; H01L 27/124; H01L 27/1255; H01L 27/1259
See application file for complete search history.

(56) References Cited

U.S. PATENT DOCUMENTS

| | | |
|---|---|---|
| 5,798,535 A | 8/1998 | Huang et al. |
| 10,985,187 B1 | 4/2021 | Nan |
| 2018/0350870 A1 | 12/2018 | Robin et al. |

(Continued)

FOREIGN PATENT DOCUMENTS

| | | |
|---|---|---|
| CN | 108198835 A | 6/2018 |
| CN | 108461516 A | 8/2018 |

(Continued)

OTHER PUBLICATIONS

PCT/CN2021/102071 international search report and written opinion.

*Primary Examiner* — Elias Ullah
(74) *Attorney, Agent, or Firm* — IPro, PLLC

(57) ABSTRACT

A chip structure, a manufacturing method thereof, and a display device are provided. The chip structure comprises a substrate, a micro light-emitting diode and a drive transistor arranged on the substrate, wherein a first pole of the drive transistor is coupled to a first electrode of the micro light-emitting diode.

18 Claims, 6 Drawing Sheets

(56) References Cited

U.S. PATENT DOCUMENTS

2020/0312237 A1* 10/2020 He .................. H10K 59/00
2021/0343780 A1   11/2021 Long

FOREIGN PATENT DOCUMENTS

| CN | 108538254 | A  | 9/2018  |
|----|-----------|----|---------|
| CN | 108847419 | A  | 11/2018 |
| CN | 110277421 | A  | 9/2019  |
| CN | 111081160 | A  | 4/2020  |
| CN | 111682043 | A  | 9/2020  |
| JP | S62274790 | A  | 11/1987 |
| KR | 940005801 | B1 | 6/1994  |

* cited by examiner

CHIP STRUCTURE AND MANUFACTURING METHOD THEREFOR, DISPLAY APPARATUS

CROSS REFERENCE TO RELATED APPLICATIONS

The present application is the U.S. national phase of PCT Application No. PCT/CN2021/102071 filed on Jun. 24, 2021, which claims priority to Chinese Patent Application No. 202010587826.8, filed in China on Jun. 24, 2020, which is incorporated herein by reference in its entirety.

TECHNICAL FIELD

The present disclosure relates to the field of display technology, and in particular to, a chip structure and a manufacturing method thereof, and a display device.

BACKGROUND

Micro LED (micro light-emitting diode) display device is a new generation of display technology, which has advantages such as high brightness, high light-emitting efficiency, low power consumption, fast response and the like.

SUMMARY

In a first aspect of the present disclosure, a chip structure is provided, including: a substrate; a micro light-emitting diode and a drive transistor that are arranged on the substrate, where a first pole of the drive transistor is coupled to a first electrode of the micro light-emitting diode.

Optionally, the micro light-emitting diode includes a plurality of film layers, the drive transistor includes a plurality of film layers, and each of the plurality of film layers in the micro light-emitting diode is arranged in the same layer as a corresponding film layer in the drive transistor.

Optionally, the plurality of film layers of micro light-emitting diode includes: a first current spreading layer, a light-emitting function layer, and a second current spreading layer which are sequentially arranged in a stack on the substrate in a direction away from the substrate; the plurality of film layers of micro light-emitting diode further includes a second electrode located at a side of the second current spreading layer facing away from the substrate;

the plurality of film layers of the drive transistor includes:
a first active layer, arranged at a side of the first current spreading layer facing away from the substrate;
a third current spreading layer, arranged at a side of the first active layer facing away from the substrate;
a second pole and a first gate electrode, arranged at a side of the third current spreading layer facing away from the substrate, where the second pole is coupled to the third current spreading layer, and the first gate electrode is insulated from the third current spreading layer; and
the first current spreading layer further functions as the first electrode and the first pole.

Optionally, each of the first current spreading layer, the second current spreading layer, and the third current spreading layer is a heavily doped film layer.

Optionally, the micro light-emitting diode further includes: a first compensation electrode, where the first compensation electrode is located between the second current spreading layer and the second electrode, the second electrode is coupled to the second current spreading layer by the first compensation electrode; and the drive transistor further includes: a second compensation electrode, where the second compensation electrode is located between the third current spreading layer and the second pole, and the second pole is coupled to the third current spreading layer by the second compensation electrode.

Optionally, the chip structure further includes a switching transistor, the switching transistor includes a plurality of film layers, and each of the plurality of film layers in the switching transistor is arranged in the same layer as a corresponding film layer in the drive transistor.

Optionally, the plurality of film layers of the switching transistor includes:
a fourth current spreading layer, arranged on the substrate;
a second active layer, arranged at a side of the fourth current spreading layer facing away from the substrate;
a fifth current spreading layer, arranged at a side of the second active layer facing away from the substrate;
a third compensation electrode, arranged at a side of the fifth current spreading layer facing away from the substrate;
a third pole, arranged at a surface of the fourth current spreading layer facing away from the substrate, where the third pole is coupled to the first gate electrode of the drive transistor; and
a fourth pole and a second gate electrode, arranged at a side of the third compensation electrode facing away from the substrate, where the fourth pole is coupled to the third compensation electrode, and the second gate electrode is insulated from the third compensation electrode.

Optionally, the second electrode, the second pole, the third pole and the fourth pole are made of a metal material.

Optionally, the chip structure further includes:
a reflective layer, arranged at a side of the substrate facing away from the micro light-emitting diode; or
a reflective layer, arranged at a side of the second current spreading layer facing away from the substrate.

Based on the technical solution of the chip structure, in a second aspect of the present disclosure, a display device is provided, including the above-mentioned chip structure, and the display device further includes an array substrate, where the array substrate includes: a base substrate; a first power source signal line, a second power source signal line and a plurality of storage capacitors which are arranged on the base substrate; where each of the plurality of storage capacitors is one-to-one correspondence to the chip structure; and
the plurality of chip structures is distributed on the array substrate in an array, in each of the plurality of chip structures, a second electrode of a micro light-emitting diode is coupled to the first power source signal line, a second pole of a drive transistor is coupled to the second power source signal line, a first gate electrode of the drive transistor is coupled to a first electrode plate of a storage capacitor, and a second electrode plate of the storage capacitor is coupled to the second pole of the drive transistor.

Optionally, the chip structure further includes a switching transistor, and the array substrate further includes a plurality of gate lines and a plurality of data lines;
the plurality of gate line is arranged to be intersected with the plurality of data line;
the plurality of chip structures are divided into a plurality of rows of chip structures that is in one-to-one correspondence to the plurality of gate lines, and a second gate electrode of a switching transistor included by each chip structure in each row of the plurality of rows of chip structures is coupled to a corresponding gate line; and the plurality of chip structures is divided into a plurality of columns of chip structures that is in one-to-one correspondence to the plurality of data lines, and a fourth pole of a switching transistor included by each chip structure in each column of the plurality of columns of chip structures is coupled to a corresponding data line.

Optionally, the second electrode of the micro light-emitting diode is coupled to the first power source signal line by a third conductive connection portion, the second pole of the drive transistor is coupled to the second power source signal line by a first conductive connection portion, and the first gate electrode of the drive transistor is coupled to the first electrode plate of the storage capacitor by a second conductive connection portion.

Based on the technical solution of the chip structure, in a third aspect of the present disclosure, a chip structure manufacturing method for manufacturing the above-mentioned chip structure is provided, where the manufacturing method includes:

manufacturing a micro light-emitting diode and a drive transistor on the substrate, where a first pole of the drive transistor is coupled to a first electrode of the micro light-emitting diode.

Optionally, the step of manufacturing the micro light-emitting diode and the drive transistor specifically includes:

forming a first current spreading layer on the substrate; where the first current spreading layer further functions as the first pole and the first electrode;

forming a light-emitting function layer and a first active layer at a side of the first current spreading layer facing away from the substrate;

forming, by one patterning process, a second current spreading layer and a third current spreading layer simultaneously, where the second current spreading layer is located at a side of the light-emitting function layer facing away from the substrate, and the third current spreading layer is located at a side of the first active layer facing away from the substrate;

forming, by one patterning process, a first compensation electrode and a second compensation electrode simultaneously, wherein the first compensation electrode is located at a side of the second current spreading layer facing away from the substrate, and the second compensation electrode is located at a side of the third current spreading layer facing away from the substrate;

forming an insulating layer covering the first compensation electrode and the second compensation electrode, where a first via hole and a second via hole is formed in the insulating layer, where a portion of the first compensation electrode is exposed by the first via hole, and a portion of the second compensation electrode is exposed by the second via hole; and forming, by one patterning process, a second electrode, a second pole and a first gate electrode which are located at a side of the insulating layer facing away from the substrate simultaneously, wherein the second electrode is coupled to the first compensation electrode by the first via hole, and the second pole is coupled to the second compensation electrode by the second via hole.

Optionally, the chip structure further includes a switching transistor, where the switching transistor includes a fourth current spreading layer, a second active layer, a fifth current spreading layer, a third compensation electrode, a third pole, a fourth pole, and a second gate electrode, and the method further includes:

forming, by the same one patterning process, the first current spreading layer and the fourth current spreading layer on the substrate simultaneously;

forming, by the same one patterning process, the first active layer and the second active layer simultaneously, where the second active layer is located at a side of the fourth current spreading layer facing away from the substrate;

forming, by the same one patterning process, the second current spreading layer, the third current spreading layer and the fifth current spreading layer simultaneously, where the fifth current spreading layer is located at a side of the second active layer facing away from the substrate;

forming, by the same one patterning process, the first compensation electrode, the second compensation electrode and the third compensation electrode simultaneously, where the third compensation electrode is located at a side of the fifth current spreading layer facing away from the substrate, and the insulating layer covers the third compensation electrode;

forming, by the same one patterning process, the first via hole, the second via hole, the third via hole and the fourth via hole in the insulating layer simultaneously, where a portion of the fourth current spreading layer is exposed by the third via hole, and a portion of the third compensation electrode is exposed by the fourth via hole; and forming, by one patterning process, the second electrode, the second pole, the first gate electrode, the third pole, the fourth pole and the second gate electrode simultaneously, where the third pole is coupled to the first gate electrode, the third pole is further coupled to the fourth current spreading layer by the third via hole, and the fourth pole is coupled to the third compensation electrode by the fourth via hole.

BRIEF DESCRIPTION OF THE DRAWINGS

The accompanying drawings illustrated hereby are to provide a further understanding of the present disclosure, which constitute a part of the present disclosure. Exemplary embodiment(s) of the present disclosure and the description there of are intended to explain the present disclosure and do not constitute an undue limitation to the present disclosure. In the drawings.

DETAILED DESCRIPTION

In order to further explain the chip structure, the manufacturing method thereof and the display device provided by embodiments according to the present disclosure, a detailed description will be given below with reference to the accompanying drawings.

When applying Micro LEDs to a large size display device, multiple Micro LEDs are generally transferred in a batch to a glass substrate formed with a driving circuit. However, due to the characteristic of threshold voltage offset for a driving transistor in the driving circuit, a complex compensation circuit needs to be formed on the glass substrate to ensure uniformity of light emitted by the Micro LEDs, resulting in a difficulty in realizing a Micro LED display device with high resolution.

Figure 1:
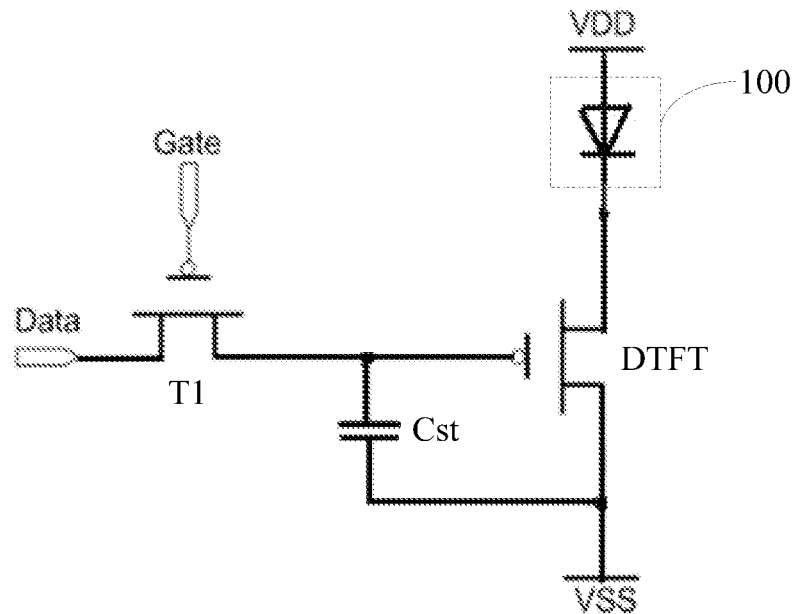
FIG. 1 is a first driving circuit diagram provided by an embodiment of the present disclosure.
Figure 2:
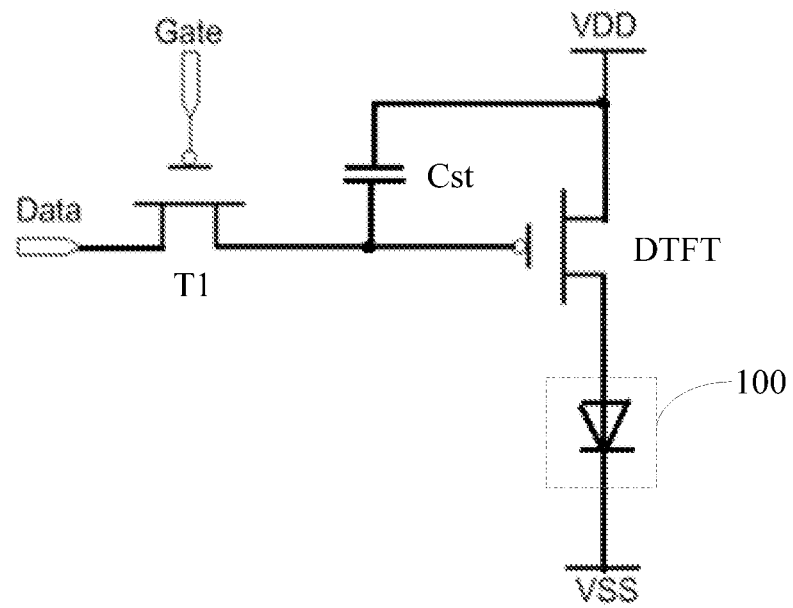
FIG. 2 is a second driving circuit diagram provided by an embodiment of the present disclosure.
Figure 5:
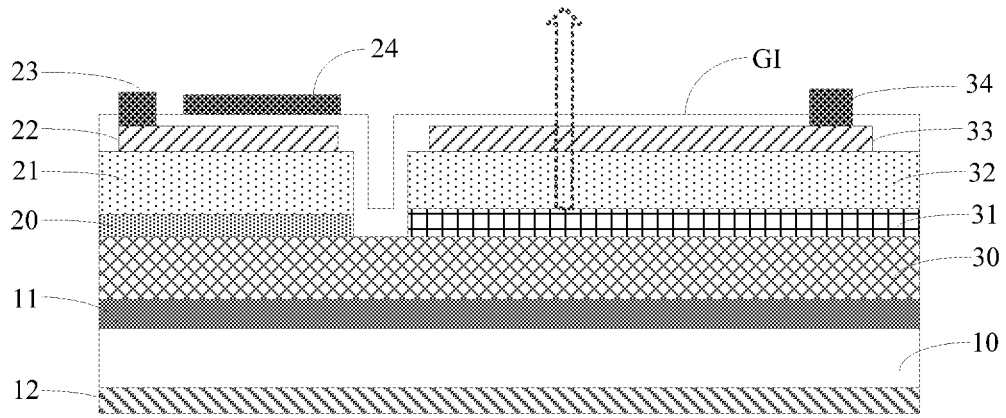
FIG. 5 is a first structural diagram of a chip structure provided by an embodiment of the present disclosure.

Referring to FIG. 1, FIG. 2 and FIG. 5, an embodiment according to the present disclosure provides a chip structure, including: a substrate 10, a micro light-emitting diode 100 and a drive transistor DTFT, where the micro light-emitting diode 100 and the drive transistor DTFT are arranged on the substrate 10, and a first pole of the drive transistor DTFT is coupled to a first electrode of the micro light-emitting diode 100.

Specifically, there may be various specific types for the micro light-emitting diode 100, and illustratively, the micro light-emitting diode 100 includes: a bluish-green micro light-emitting diode 100 or a reddish-yellow light-emitting diode.

Illustratively, the chip structure is formed as a normal chip structure, a flip-chip structure, or a vertical chip structure.

Illustratively, the substrate 10 includes a sapphire substrate, or an N-type gallium arsenide substrate.

Illustratively, the chip structure further includes a buffer layer 11, where the buffer layer 11 is located between the substrate 10 and the micro light-emitting diode 100, as well as between the substrate 10 and the drive transistor DTFT.

As shown in FIGS. 1 and 2, the driving circuit that drives the micro light-emitting diode 100 to light-emitting includes at least: a switching transistor T1, a storage capacitor Cst and a drive transistor DTFT. The switching transistor T1 has no pixel current flowing therethrough, and the driving transistor DTFT has a pixel current following therethrough. The size of the drive transistor DTFT mainly relates to the mobility of the first active layer 20 included in DTFT, and the magnitude of the pixel current flowing therethrough. As the pixel current increases, the size of the drive transistor DTFT and the size of the driving circuit size will also increase.

When the driving circuit adopts the above-mentioned structure, the switching transistor T1 may be formed on an array substrate, and the drive transistor DTFT and the micro light-emitting diode 100 may be integrated on the chip structure. In this manner, when the chip structure is arranged on the array substrate, the driving circuit corresponding to each micro light-emitting diode 100 still includes a complete driving circuit, enabling to drive the micro light-emitting diode 100 to emit light.

It should be noted that one pole of the first pole and second pole 23 of the drive transistor DTFT functions as an input electrode, and the other pole functions as an output electrode. One electrode of the first electrode and the second electrode 34 of the micro light-emitting diode 100 functions as an anode, and the other electrode functions as a cathode.

In the chip structure provided by embodiments according to the present disclosure, both the micro light-emitting diode 100 and the drive transistor DTFT are integrated on the chip structure, so that the drive transistor DTFT does not occupy the area of the array substrate, the space occupied by each driving circuit on the array substrate becomes smaller, which can effectively increase the quantity of driving circuits included on the array substrate. In this manner, when transferring the chip structure in batch to the array substrate to form a display device having the micro light-emitting diode 100, the quantity of chip structures arranged in the display device can be effectively improved, thereby addressing the issue that it is difficult to realize a Micro LED display device with a high-resolution in the related art.

In some embodiments, the micro light-emitting diode includes a plurality of film layers, and the drive transistor includes a plurality of film layers, and each film layer in the micro light-emitting diode is arranged in the same layer as a corresponding film layer in the drive transistor.

As shown in FIG. 5, in some embodiments, the micro light-emitting diode 100 includes the following elements that are arranged in a stack on the substrate 10 sequentially in a direction away from the substrate 10: a first current spreading layer 30, a light-emitting function layer 31 and a second current spreading layer 32. The micro light-emitting diode 100 further includes a second electrode 34 located at a side of the second current spreading layer 32 facing away from the substrate 10;

The drive transistor DTFT includes:
  a first active layer 20, arranged at a side of the first current spreading layer 30 facing away from the substrate 10;
  a third current spreading layer 21, arranged at a side of the first active layer 20 facing away from the substrate 10;
  a second pole 23 and a first gate electrode 24, arranged at a side of the third current spreading layer 21 facing away from the substrate 10, where the second pole 23 is coupled to the third current spreading layer 21, and the first gate electrode 24 is insulated from the third current spreading layer 21; and
  the first current spreading layer 30 further functions as the first electrode and the first pole.

Specifically, in a case that the micro light-emitting diode 100 adopts a bluish-green color micro light-emitting diode 100, the micro light-emitting diode 100 is generally formed by processing a GaN (gallium nitride) epitaxial wafer that is grown on a sapphire substrate using a MOCVD (vapor phase epitaxial growth technique). Illustratively, the buffer layer 11 includes a GaN buffer layer, the first current spreading layer 30 includes an N-type heavily doped GaN current spreading layer, the light-emitting function layer 31 includes a multi-quantum well structure including InGaN (Indium gallium nitride) layers and GaN layers that are fabricated alternately on one another, and the second current spreading layer 32 includes a P-type heavily doped GaN current spreading layer.

When the micro light-emitting diode 100 adopts a reddish-yellow color micro light-emitting diode 100, the micro light-emitting diode 100 is generally formed by processing an AlGaInP (aluminum gallium indium phosphide) epitaxial wafer that is grown on a GaAs (gallium arsenide) substrate or a sapphire substrate using a MOCVD technique. Illustratively, the first current spreading layer 30 includes a N-type heavily doped AlGaInP current spreading layer, the light-emitting function layer 31 includes a multi-quantum well active layer including AlGaInP layers and InGaP layers that are fabricated alternately on one another, and the second current spreading layer 32 includes a P-type heavily doped AlGaInP current spreading layer.

When the micro light-emitting diode 100 adopts a vertical structure, illustratively, the second current spreading layer 32 includes an N-type heavily doped AlGaInP current spreading layer, the light-emitting function layer 31 includes a multi-quantum well active layer including AlGaInP layers and InGaP layers that that are fabricated alternately on one another, and the first current spreading layer 30 includes a P-type heavily doped AlGaInP current spreading layer.

Illustratively, as shown in FIGS. 8a to 8h, when manufacturing the micro light-emitting diode 100 and the drive transistor DTFT of the above-mentioned structure, a buffer layer 11 is formed on a substrate 10 firstly, and then a first current spreading layer 30 is fabricated at a side of the buffer layer 11 facing away from the substrate 10. Thereafter, a light-emitting function thin film is fabricated at a side of the first current spreading layer 30 facing away from the substrate 10, and then the light-emitting function thin film is patterned. The light-emitting function thin film outside the light-emitting region is removed by a semiconductor process (PR glue coating-exposure-developing-etching-peeling off), to form the light-emitting function layer 31. Afterwards, a layer of active film layer is fabricated at the side of the first current spreading layer 30 facing away from the substrate 10 by using an epitaxial technique, and then the active film layer except for a first active layer 20 is removed by exposing and developing, to form the first active layer 20. An orthographic projection of the first active layer onto the substrate 10 is located within an orthographic projection of the first current spreading layer 30 onto the substrate 10. Next, a P-type current spreading thin film is formed by using an MOCVD deposition, and the P-type current spreading thin film is patterned to form a second current spreading layer 32 and a third current spreading layer 21 simultaneously. Finally a conductive film layer is formed at a side of the second current spreading layer 32 facing away from the substrate 10, and the conductive film layer is patterned to form a second electrode 34, a second pole 23 and a first gate electrode 24 simultaneously. The second electrode 34 is located at the side of the second current spreading layer 32 facing away from the substrate 10. The second pole 23 and the first gate electrode 24 is located at a side of the third current spreading layer 21 facing away from the substrate 10. The second electrode 34 is coupled to the second current spreading layer 32, the second pole 23 is coupled to the third current spreading layer 21, and the first gate electrode 24 is insulated from the third current spreading layer 21.

The light-emitting function layer 31 and the first active layer 20 are structures independent with each other, the second current spreading layer 32 and the third current spreading layer 21 are independent structures from each other, the light-emitting function layer 31 and the second current spreading layer 32 are formed as a step-shaped structure being protruded with respect to the first current spreading layer 30, and the first active layer 20 and the third current spreading layer 21 are formed as a step-shaped structure being protruded with respect to the first current spreading layer 30.

It should be illustrated that in the process of manufacturing the chip structure, a cleaning operation may be performed when a corresponding film layer has been fabricated, so as to ensure a better performance of the chip structure.

It is noted that the first current spreading layer 30, the second current spreading layer 32 and the third current spreading layer 21 are all heavily doped film layers having a good electrical conductivity.

In the chip structure provided by the above-mentioned embodiment, with the first current spreading layer 30 which functions as both the first electrode and the first pole at the same time, there is no need to fabricate additional first electrode and first pole, while a good electrical connection performance of the first electrode and the first pole can be ensured.

In addition, in the chip structure provided by the above-mentioned embodiment, the drive transistor DTFT adopts a field effect transistor in a vertical structure, and the field effect transistor in the vertical structure is a type of field effect transistor for shortening the channel length, and controls a change in the current of the source-drain electrode by changing the gate voltage. The main features of this structure are as follows. The channel length is reduced from an order of micrometer to an order of nanometer, and the operating current of the device are greatly increased while the turn-on voltage of the device is reduced. Since the organic field-effect transistor having a vertical structure is similar to the micro light-emitting diode 100 in structure, some steps can be added or changed in the process of manufacturing the micro light-emitting diode 100 to manufacture the field-effect transistor having a vertical structure at the same time, so that the drive transistor DTFT is compatible with the process of manufacturing the micro light-emitting diode 100 in the related art. In this manner, the process of manufacturing the chip structure can be simplified greatly, and the manufacturing cost can be saved. Furthermore, in the chip structure provided by the above-mentioned embodiment, the field-effect transistor in the vertical structure is integrated into the chip structure including the micro light-emitting diode 100, which enables the driving circuit and the micro light-emitting diode 100 being manufactured simultaneously and transferred simultaneously, thereby addressing a difficulty in transferring in huge quantities and improving an efficiency of the transferring.

In addition, the first active layer 20 of the drive transistor DTFT grown based on the epitaxial technique has a relatively high mobility, and the size of the drive transistor DTFT can be relatively small, which is favorable for a Micro LED display device with a high resolution.

As shown in FIG. 5, in some embodiments, the micro light-emitting diode 100 further includes: a first compensation electrode 33, where the first compensation electrode 33 is located between the second current spreading layer 32 and the second electrode 34, and the second electrode 34 is coupled to the second current spreading layer 32 by the first compensation electrode 33.

The drive transistor DTFT further includes: a second compensation electrode 22, where the second compensation electrode 22 is located between the third current spreading layer 21 and the second pole 23, and the second pole 23 is coupled to the third current spreading layer 21 by the second compensation electrode 22.

Specifically, the first compensation electrode 33 and the second compensation electrode 22 are made of a conductive material. Illustratively, the first compensation electrode 33 and the second compensation electrode 22 are made of a transparent Indium Tin Oxide (ITO), so that the first compensation electrode 33 and the second compensation electrode 22 have good conductive properties.

More specifically, after forming the second current spreading layer 32 and the third current spreading layer 21 by patterning, the second current spreading layer 32, the third current spreading layer 21, and a part of the first current spreading layer 30 may be exposed. With a patterning process, the first compensation electrode 33 is formed at a side of the second current spreading layer 32 facing away from the substrate 10, and the second compensation electrode 22 is formed at a side of the third current spreading layer 21 facing away from the substrate 10. The first compensation electrode 33 is formed to be in an ohmic contact with the second current spreading layer 32, and the second compensation electrode 22 is formed to be in an ohmic contact with the third current spreading layer 21.

Since the above-mentioned the micro light-emitting diode 100 includes the first compensation electrode 33 and the second compensation electrode 22, this is more favorable for current spreading, thereby improving the performance of the chip structure.

In some embodiments, the chip structure further includes a switching transistor, where the switching transistor includes a plurality of film layers, and each film layer in the switching transistor is arranged in the same layer as a corresponding film layer in the drive transistor.

Figure 7:
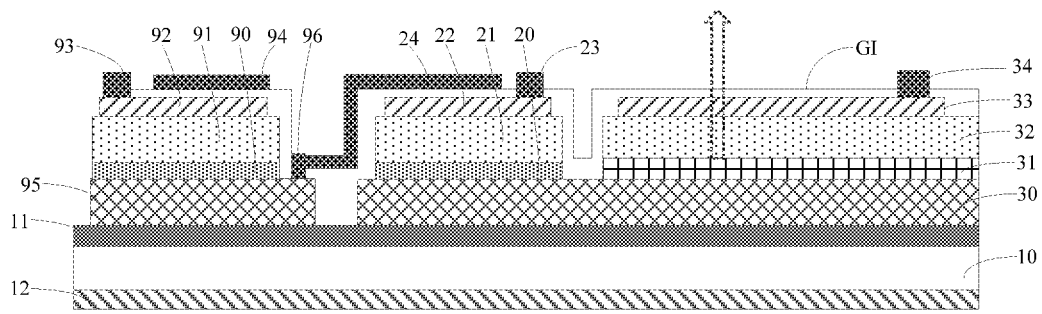
FIG. 7 is a second structural diagram of a chip structure provided by an embodiment of the present disclosure.
Figure 8A:
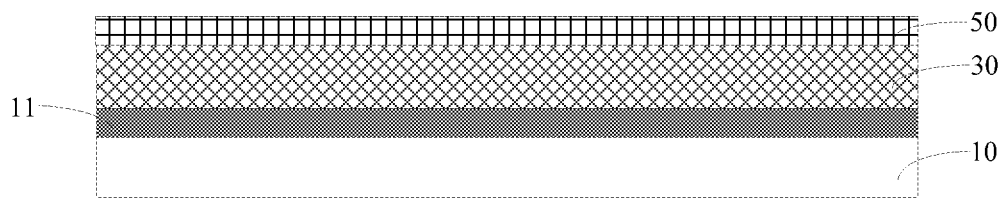
FIG. 8a to FIG. 8h are schematic flow diagrams of manufacturing a chip structure provided by an embodiment of the present disclosure.
Figure 8B:
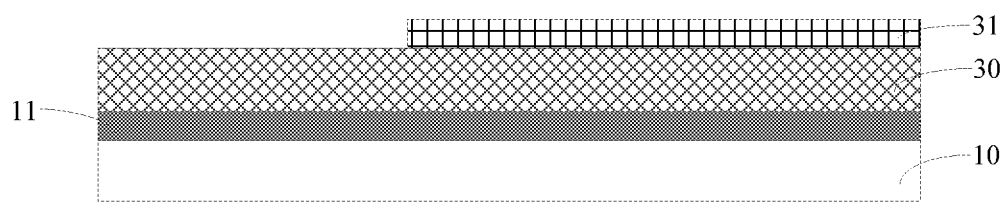
Figure 8C:
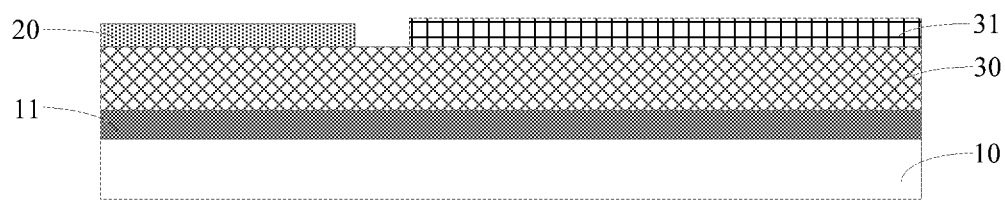
Figure 8D:
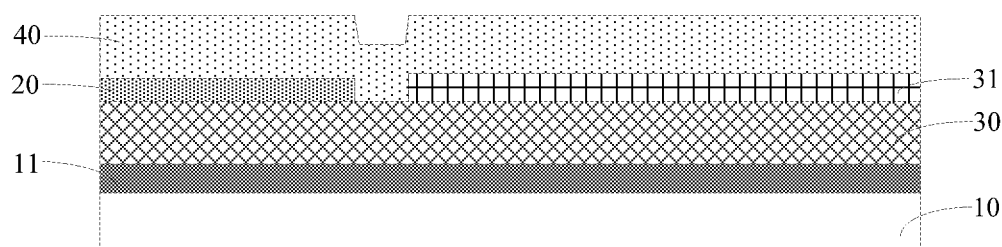
Figure 8E:
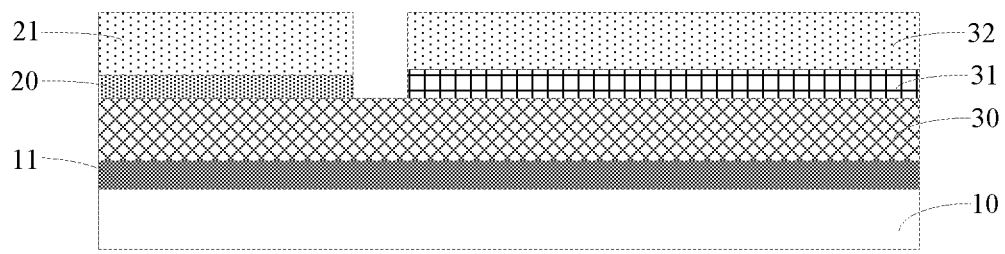
Figure 8F:
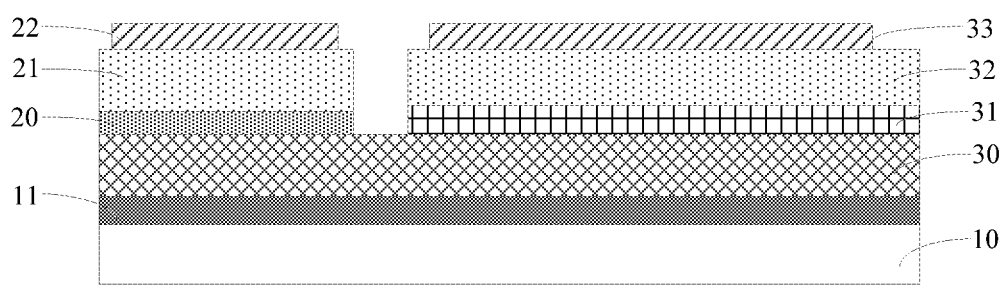
Figure 8G:
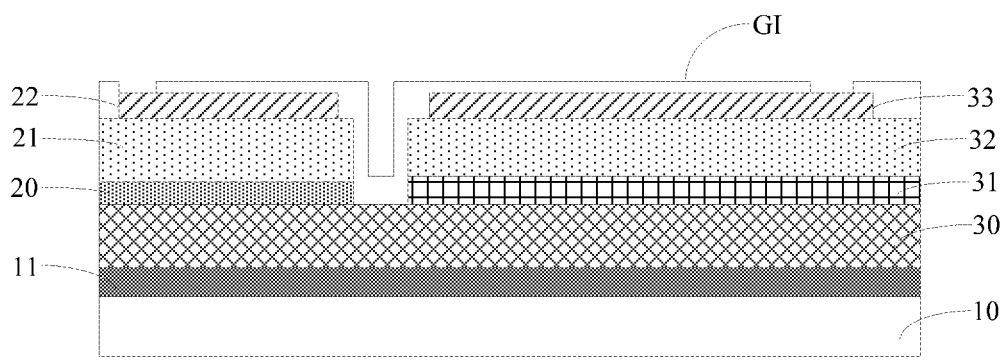
Figure 8H:
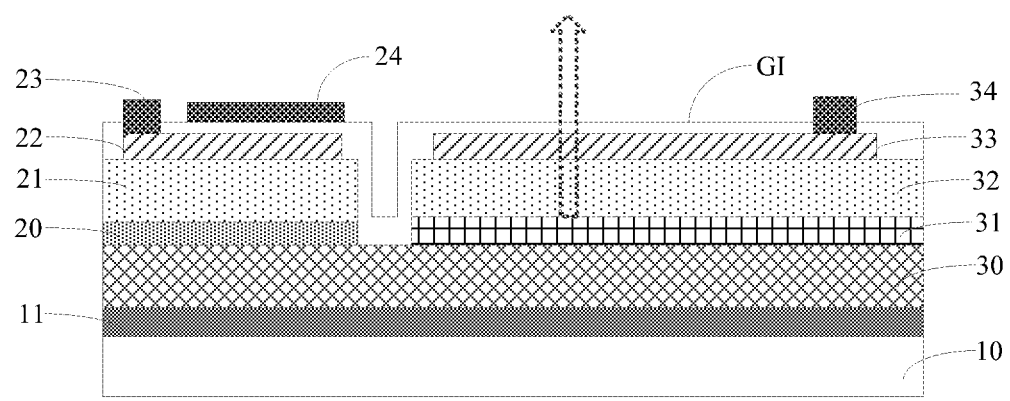

As shown in FIGS. 1, 2 and 7, in some embodiments, the chip structure further includes a switching transistor T1, where the switching transistor T1 includes:
- a fourth current spreading layer 95, arranged on the substrate 10;
- a second active layer 90, arranged at a side of the fourth current spreading layer 95 facing away from the substrate 10;
- a fifth current spreading layer 91, arranged at a side of the second active layer 90 facing away from the substrate 10;
- a third compensation electrode 92, arranged at a side of the fifth current spreading layer 91 facing away from the substrate 10;
- a third pole 96, arranged at a surface of the fourth current spreading layer 95 facing away from the substrate 10, where the third pole 96 is coupled to the first gate electrode 24 of the drive transistor; and
- a fourth pole 93 and a second gate electrode 94, arranged at a side of the third compensation electrode 92 facing away from the substrate 10, where the fourth pole 93 is coupled to the third compensation electrode 92, and the second gate electrode 94 is insulated from the third compensation electrode 92.

Specifically, the chip structure further includes a switching transistor T1. A second gate electrode 94 of the switching transistor T1 is configured to receive a scanning signal, a third pole 96 of the switching transistor T1 is coupled to the first gate electrode 24 of the drive transistor DTFT, and a fourth pole 93 of the switching transistor T1 is configured to receive a data signal. In an on-state, the switching transistor T1 can write the data signal to the first gate electrode 24 of the drive transistor DTFT.

When fabricating the switching transistor T1, the first current spreading layer 30 and the fourth current spreading layer 95 may be formed on the substrate 10 by the same one patterning process simultaneously. The first active layer 20 and a second active layer 90 located at a side of the fourth current spreading layer 95 facing away from the substrate 10 may be formed by the same one patterning process simultaneously. The second current spreading layer 32, the third current spreading layer 21 and the fifth current spreading layer 91 located at a side of the second active layer 90 facing away from the substrate 10 may be formed by the same one patterning process simultaneously. The first compensation electrode 33, the second compensation electrode 22 and the third compensation electrode 92 located at a side of the fifth current spreading layer 91 facing away from the substrate 10 may be formed by the same one patterning process simultaneously. Next, an insulating layer GI covering all regions of the substrate 10 is formed. A first via hole, a second via hole, a third via hole and a fourth via hole may be formed on the insulating layer GI by the same one patterning process simultaneously, where a portion of the fourth current spreading layer 95 is exposed by the third via hole, and a portion of the third compensation electrode 92 is exposed by the fourth via hole. The second electrode 34, the second pole 23, the first gate electrode 24, the third pole 96, the fourth pole 93 and the second gate electrode 94 may be formed by one patterning process simultaneously, where the third pole 96 is coupled to the first gate electrode 24, the third pole 96 further coupled to the fourth current spreading layer 95 by the third via hole, the fourth pole 93 is coupled to the third compensation electrode 92 by the fourth via hole.

Illustratively, the insulating layer GI is made of $SiO_2$ or $SiN_x$, and the first via hole to the fourth via hole may be formed by a photolithographic process. The insulating layer GI has an insulation function as well as a protecting function.

The second electrode 34, the second pole 23, the third pole 96 and the fourth pole 93 are made of a metal material. Illustratively, the second electrode 34, the second pole 23, the third pole 96 and the fourth pole 93 are formed, by using the metal material, to be a staked structure such as a stacked structure of Cr/Pt/Au or Cr/Ni/Al formed by using a lift-off process.

Illustratively, the first current spreading layer 30 and the fourth current spreading layer 95 may be, optionally, a N-type current spreading layer; the second current spreading layer 32, the third current spreading layer 21 and the fifth current spreading layer 91 may be, optionally, a P-type current spreading layer.

Illustratively, the first current spreading layer 30 and the fourth current spreading layer 95 may be, optionally, a P-type current spreading layer; the second current spreading layer 32, the third current spreading layer 21 and the fifth current spreading layer 91 may be, optionally, a N-type current spreading layer.

In the chip structure provided by the above-mentioned embodiments, the field-effect transistor having the vertical structure is integrated into the chip structure including the micro light-emitting diode 100, which is favorable for manufacturing and then transferring the driving circuit and the micro light-emitting diode 100 simultaneously, eases a difficulty in transferring in huge amount and improves an efficiency of the transferring.

Figure 3:
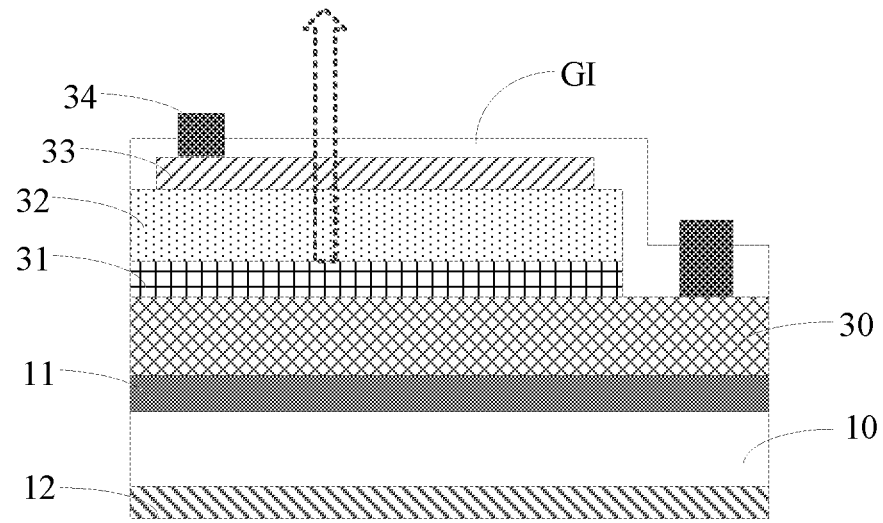
FIG. 3 is a schematic structural diagram of a micro light-emitting diode with a normal chip structure provided by an embodiment of the present disclosure.

In some embodiments, the chip structure further includes: a reflective layer 12 arranged at a side of the substrate 10 facing away from the micro light-emitting diode as shown in FIG. 3. Alternatively, the chip structure further includes: a reflective layer 12 arranged at a side of the second current spreading layer 32 facing away from the substrate 10 as shown in FIG. 4.

Specifically, the chip structure may be divided into a normal chip structure and a flip-chip structure according to different light emitting surfaces, where in the normal chip structure, the light exits from a side of the chip structure facing away from the substrate 10, and in the flip-chip structure, the light exits from a side at which the substrate 10 is located.

As shown in FIGS. 3 and 7, in a case that the normal chip structure is adopted, a reflective layer 12 may be arranged at a side of the substrate 10 facing away from the micro light-emitting diode 100. Illustratively, orthographic projections of the micro light-emitting diode 100, the drive transistor DTFT, and the switching transistor T1 onto the substrate 10 are all located within an orthographic projection of the reflective layer 12 on the substrate 10.

Figure 4:
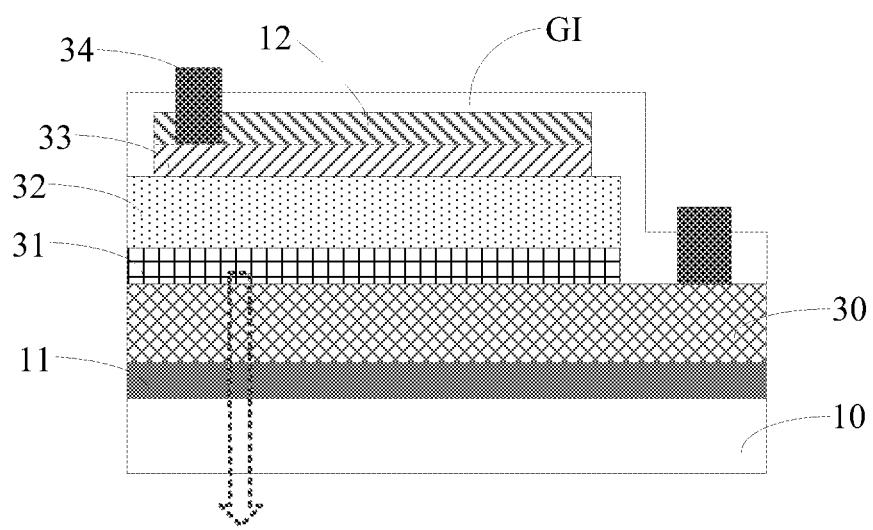
FIG. 4 is a schematic structural diagram of a micro light-emitting diode with a flip-chip structure provided by an embodiment of the present disclosure.

As shown in FIG. 4, in a case that the flip-chip structure is adopted, a reflective layer 12 may be arranged at a side of the second current spreading layer 32 facing away from the substrate 10. Illustratively, the reflective layer 12 is located between the first compensation electrode 33 and the second electrode 34, where the first via hole penetrates the reflective layer 12. Illustratively, an orthographic projection of the micro light-emitting diode 100 onto the substrate 10 is located within an orthographic projection of the reflective layer 12 onto the substrate 10.

As the chip structure further includes the reflective layer 12, when the light is incident on the reflective layer 12, the reflective layer 12 may cause the light to exit from a light-exiting side of the chip structure, thereby improving the light output efficiency of the chip structure.

Figure 6:
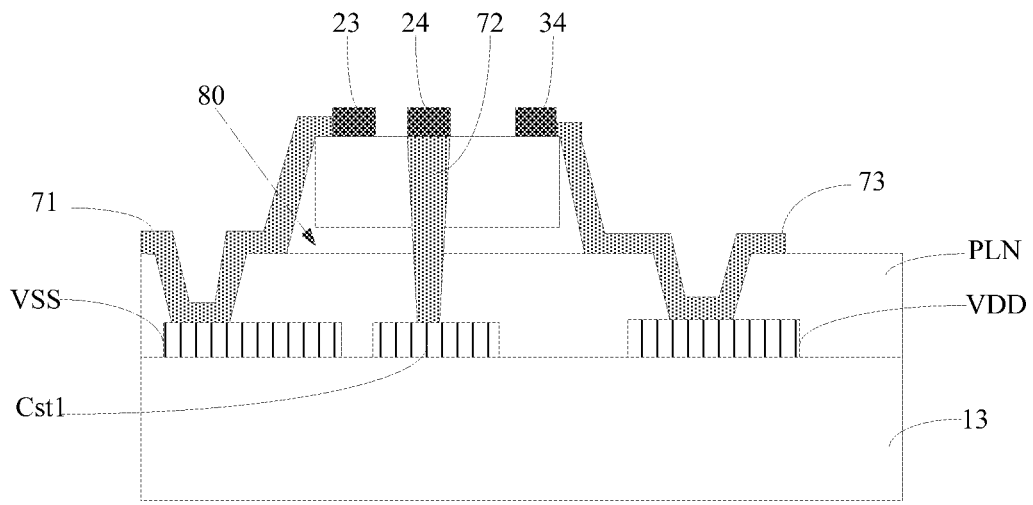
FIG. 6 is a schematic diagram showing bonding a chip structure to an array substrate provided by an embodiment of the present disclosure.

As shown in FIG. 6, embodiments of the present disclosure also provides a display device including a plurality of chip structures as provided by the above-mentioned embodiments, the display device further includes an array substrate. The array substrate includes: a base substrate 13, and a first power source signal line VDD, a second power source signal line VSS and a plurality of storage capacitors Cst which are arranged on the base substrate 13; where the storage capacitors Cst are in one-to-one correspondence to the chip structures; and The plurality of chip structures is arranged on the array substrate in an array. In each chip structure, the second electrode 34 of the micro light-emitting diode 100 is coupled to the first power source signal line VDD, the second pole 23 of the drive transistor DTFT is coupled to the second power source signal line VSS, the first gate electrode 24 of the drive transistor DTFT is coupled to a first electrode plate Cst1 of a storage capacitor Cst, and a second electrode plate Cst2 of the storage capacitor Cst is coupled to the second power source signal line VSS.

Specifically, the array substrate functions as a back plate structure of the display device, including: a base substrate 13, and a first power source signal line VDD, a second power source signal line VSS and a plurality of storage capacitors Cst which are arranged on the base substrate 13. Illustratively, the first power source signal line VDD includes a positive power source signal line, and the second power source signal line VSS includes a negative power source signal line.

Illustratively, the storage capacitors Cst are in one-to-one correspondence to the chip structures, the first electrode plate Cst1 of the storage capacitor Cst is coupled to the first gate electrode 24 of the drive transistor DTFT, and the second electrode plate Cst2 of the storage capacitor Cst is coupled to the second pole 23 of the drive transistor DTFT, so as to store a data signal.

The specific structures for driving circuit corresponding to the chip structure may be various, and two exemplary specific structures for the driving circuit are given hereinafter.

In a first structure, as shown in FIG. 1, the first pole of the drive transistor DTFT is a drain electrode, the second pole 23 of the drive transistor DTFT is a source electrode, the first electrode of the micro light-emitting diode 100 is a cathode, the second electrode 34 of the micro light-emitting diode 100 is an anode, the second electrode 34 is coupled to the first power source signal line VDD, and the second pole 23 of the drive transistor DTFT is coupled to the second power source signal line VSS. The first electrode plate Cst1 of the storage capacitor Cst is coupled to the first gate electrode 24 of the drive transistor DTFT, and the second electrode plate Cst2 of the storage capacitor Cst is coupled to the second pole 23 of the drive transistor DTFT.

In a second structure, as shown in FIG. 2, the first pole of the drive transistor DTFT is a source electrode, the second pole 23 of the drive transistor DTFT is a drain electrode, the first electrode of the micro light-emitting diode 100 is an anode, the second electrode 34 of the micro light-emitting diode 100 is a cathode, the second electrode 34 is coupled to the second power source signal line VSS, and the second pole 23 of the drive transistor DTFT is coupled to the first power source signal line VDD. The first electrode plate Cst1 of the storage capacitor Cst is coupled to the first gate electrode 24 of the drive transistor DTFT, and the second electrode plate Cst2 of the storage capacitor Cst is coupled to the first power source signal line VDD.

By adjusting the voltage of the first gate electrode 24 of the drive transistor DTFT, the current flowing through the drive transistor DTFT can be controlled, thereby controlling the luminous intensity of the micro light-emitting diode 100.

As shown in FIG. 6, when integrating the drive transistor DTFT into the chip structure, the chip structure includes three bonding points including the second electrode 34 of the micro light-emitting diode 100, the second pole 23 of the drive transistor DTFT and the first gate electrode 24. A bonding point for the second power source signal line VSS, a bonding point for the first power source signal line VDD and a bonding point for a first electrode plate Cst1 of the storage capacitor Cst are included in the corresponding array substrate. When the above-mentioned first structure is adopted, as shown in FIG. 6, the second electrode 34 is bonded to the corresponding second power source signal line VSS in the array substrate, the second pole 23 is bonded to the corresponding first power source signal line VDD in the array substrate, and the first gate electrode 24 is bonded to the corresponding first electrode plate Cst1 of the storage capacitor Cst in the array substrate.

It is noted that when the chip structure is bonded onto the array substrate, with respect to a normal chip structure as shown in FIG. 6, the bonding points of the chip structure are arranged to be facing away from the array substrate, and the bonding points on the chip structure and the bonding points on the array substrate are bonded together by a first conductive connection portion 71, a second conductive connection portion 72 and a third conductive connection portion 73. In addition, the array substrate is further provided with a planarization layer PLN. Moreover, a filling material 80 may be filled between the chip structure and the array substrate to ensure the reliability after the chip structure is bonded.

It is noted that the display device may be any product or component with a display function, such as a television, a displayer, a digital photo frame, a mobile phone or a tablet computer.

In the display device provided by embodiments of the present disclosure, both the micro light-emitting diode 100 and the drive transistor DTFT are integrated on the chip structure, so that the drive transistor DTFT does not occupy the area of the array substrate, as a result, the space occupied by each driving circuit on the array substrate becomes small, which can effectively increase the quantity of driving circuits included on the array substrate. In this manner, when transferring the chip structure to the array substrate in batch to form the display device including the micro light-emitting diode 100, the quantity of the chip structures arranged in the display device can be effectively increased, thereby addressing the issue that it is difficult to realize a Micro LED display device with a high resolution in the related art.

As shown in FIGS. 1, 2 and 7, in some embodiments, the chip structure further includes a switching transistor T1, and the array substrate further includes a plurality of gate lines Gate and a plurality of data lines Data; the gate lines Gate are arranged to be intersected with the data lines Data;

The plurality of chip structures are divided into a plurality of rows of chip structures that is in one-to-one correspondence to the plurality of gate lines Gate, and a second gate electrode of a switching transistor T1 included in each chip structure in each row of chip structures is coupled to a corresponding gate line Gate.

The plurality of chip structures are divided into a plurality of columns of chip structures that is in one-to-one correspondence to the plurality of data lines Data, and a fourth pole of a switching transistor included in each chip structure in each column of chip structures is coupled to a corresponding data line Data.

Specifically, the array substrate further includes a plurality of gate lines Gate and a plurality of data lines Data; the gate line Gate is arranged to be intersected with the data line Data. Illustratively, a plurality of chip structures is distributed in an array, and may be divided into a plurality of rows of chip structures that is in one-to-one correspondence to the plurality of gate lines Gate, and a plurality of columns of chip structures that is in one-to-one correspondence to the plurality of data lines Data.

Each of the chip structures further includes a switching transistor T1, and a second gate electrode 94 of a switching transistor T1 included by each chip structure in each row of chip structures is coupled to a corresponding gate line Gate; a fourth pole 93 of a switching transistor T1 included by each chip structure in each column of chip structures is coupled to a corresponding data line Data. The switching transistor T1 is turned on under the control of the corresponding gate line Gate, and a data signal, provided by a data line Data coupled to the switching transistor T1, is written to the first gate electrode 24 of the drive transistor DTFT.

In the display device provided by the above-mentioned embodiments, the switching transistor T1 with a vertical structure is integrated into the chip structure including the micro light-emitting diode 100, which enables simultaneous manufacturing and then transferring the driving circuit and the micro light-emitting diode 100, eases a difficulty in transferring in huge quantities and improves an efficiency of the transferring.

Embodiments of the present disclosure also provides a method of manufacturing chip structures, for manufacturing the chip structure provided by the embodiments as described above. The method includes: manufacturing a micro light-emitting diode 100 and a drive transistor DTFT on a substrate 10, where a first pole of the drive transistor DTFT is coupled to a first electrode of the micro light-emitting diode 100.

In the display device provided by the embodiments of the present disclosure, both the micro light-emitting diode 100 and the drive transistor DTFT are integrated on the chip structure, so that the drive transistor DTFT does not occupy the area of the array substrate. As a result, the space occupied by each driving circuit so on the array substrate becomes smaller, which can effectively increase the quantity of driving circuit included on the array substrate. In this manner, when transferring the chip structures to the array substrate in batch to form the display device including micro light-emitting diodes 100, the quantity of chip structures included in the display device can be effectively increased, thereby addressing the issue that it is difficult to realize a Micro LED display device with a high resolution in the related art.

In some embodiments, the step of manufacturing the micro light-emitting diode and the drive transistor DTFT specifically includes:

forming a first current spreading layer 30 on the substrate 10;

forming a light-emitting function layer 31 and a first active layer 20 at a side of the first current spreading layer 30 facing away from the substrate 10;

forming, by one patterning process, a second current spreading layer 32 and a third current spreading layer 21 simultaneously, the second current spreading layer 32 being located at a side of the light-emitting function layer 31 facing away from the substrate 10, and the third current spreading layer 21 being located at a side of the first active layer 20 facing away from the substrate 10;

forming, by one patterning process, a first compensation electrode 33 and a second compensation electrode 22 simultaneously, the first compensation electrode 33 being located at a side of the second current spreading layer 32 facing away from the substrate 10, and a second compensation electrode 22 being located at a side of the third current spreading layer 21 facing away from the substrate 10;

forming an insulating layer GI covering the first compensation electrode 33 and the second compensation electrode 22, forming a first via hole and a second via hole on the insulating layer GI, a portion of the first compensation electrode 33 being exposed by the first via hole, and a portion of the second compensation electrode 22 being exposed by the second via hole; and forming, by one patterning process, a second electrode 34, a second pole 23 and a first gate electrode 24 which are at a side of the insulating layer GI facing away from the substrate 10 simultaneously, the second electrode 34 being coupled to the first compensation electrode 33 by the first via hole, and the second pole 23 being coupled to the second compensation electrode 22 by the second via hole.

Specifically, when the micro light-emitting diode 100 adopts a bluish-green color micro light-emitting diode 100, the micro light-emitting diode 100 is generally formed by processing a GaN (Gallium Nitride) epitaxial wafer that is grown on a sapphire substrate 10 using an MOCVD (vapor phase epitaxial growth technique). More specifically, the buffer layer 11 includes a GaN buffer layer 11, the first current spreading layer 30 includes an N-type heavily doped GaN current spreading layer, the light-emitting function layer 31 includes a multi-quantum well structure including alternating InGaN and GaN layers, and the second current spreading layer 32 includes a P-type heavily doped GaN current spreading layer.

When the micro light-emitting diode 100 adopts a reddish-yellow light micro light-emitting diode 100, the micro light-emitting diode 100 is generally formed by processing an AlGaInP (Aluminum Gallium Indium Phosphide) epitaxial wafer that is grown on a GaAs (Gallium Arsenide) substrate 10 or a sapphire substrate 10 using a MOCVD technique. More specifically, the first current spreading layer 30 includes an N-type heavily doped AlGaInP current spreading layer, the light-emitting function layer 31 includes a multi-quantum well active layer including alternating AlGaInP and InGaP layers, and the second current spreading layer 32 includes a P-type heavily doped AlGaInP current spreading layer.

When manufacturing the micro light-emitting diode 100 and drive transistor DTFT, a buffer layer 11 is formed on a substrate 10 firstly, and then a first current spreading layer 30 is manufactured at a side of the buffer layer 11 facing away from the substrate 10. Thereafter, a light-emitting function thin film is manufactured at a side of the first current spreading layer 30 facing away from the substrate 10. The light-emitting function thin film is patterned, and the light-emitting function thin film outside the light-emitting region is removed by a semiconductor process (PR glue coating-exposure-developing-etching-peeling off) to form the light-emitting function layer 31. Afterwards, an active film layer is manufactured at the side of the first current spreading layer 30 facing away from the substrate 10 by using an epitaxial technique, and then the active film layer except for the first active layer 20 is removed by exposing and developing, so as to form the first active layer 20. An orthographic projection of the first active layer onto the substrate 10 is located inside an orthographic projection of the first current spreading layer 30 onto the substrate 10. Next, a P-type current spreading thin film is formed by using an MOCVD deposition, and the P-type current spreading thin film is patterned to form the second current spreading layer 32 and the third current spreading layer 21 at the same time.

After the second current spreading layer 32 and the third current spreading layer 21 is formed by patterning, the second current spreading layer 32, the third current spreading layer 21, and a part of the first current spreading layer 30 can be exposed. In one patterning process, the first compensation electrode 33 is formed at a side of the second current spreading layer 32 facing away from the substrate 10, and the second compensation electrode 22 is formed at a side of the third current spreading layer 21 facing away from the substrate 10. The first compensation electrode 33 is formed to be in ohmic contact with the second current spreading layer 32, and the second compensation electrode 22 is formed to be in ohmic contact with the third current spreading layer 21.

Next, an insulating layer GI covering the first compensation electrode 33 and the second compensation electrode 22 is formed, and a first via hole and a second via hole are formed on the insulating layer GI. A portion of the first compensation electrode 33 is exposed by the first via hole, and a portion of the second compensation electrode 22 is exposed by the second via hole.

Finally, a conductive film layer is formed at the side of the second current spreading layer 32 facing away from the substrate 10, and one patterning process is performed on the conductive film layer to form a second electrode 34, a second pole 23 and a first gate electrode 24 which are located at a side of the insulating layer GI facing away from the substrate 10 at the same time. The second electrode 34 is coupled to the first compensation electrode 33 by the first via hole, and the second pole 23 is coupled to the second compensation electrode 22 by the second via hole.

In the manufacturing method provided by the above-mentioned embodiments, the micro light-emitting diode 100 and the drive transistor DTFT can be manufactured at the same time, and thus the process of manufacturing the chip structure is greatly simplified to save manufacturing cost. Furthermore, in the chip structure provided by the above-mentioned embodiments, the field-effect transistor in a vertical structure is integrated into the chip structure including the micro light-emitting diode 100, this enables manufacturing and transferring the driving circuit and the micro light-emitting diode 100 simultaneously, eases a difficulty in transferring in huge quantity and improves an efficiency of the transferring.

In addition, since the first active layer 20 of the drive transistor DTFT grown based on the epitaxial technique has a higher mobility, the size of the drive transistor DTFT can be smaller, thereby being favorable for realizing a Micro LED display device with a high resolution.

In some embodiments, the chip structure includes a switching transistor T1, where the switching transistor T1 includes a fourth current spreading layer, a second active layer, a fifth current spreading layer, a third compensation electrode, a third pole, a fourth pole, and a second gate electrode, the method further comprise:

forming, by the same one patterning process, the first current spreading layer 30 and the fourth current spreading layer 95 on the substrate 10 simultaneously;

forming, by the same one patterning process, the first active layer 20 and the second active layer 90 simultaneously, the second active layer 90 being located at a side of the fourth current spreading layer 95 facing away from the substrate 10;

forming, by the same one patterning process, the second current spreading layer 32, the third current spreading layer 21 and the fifth current spreading layer 91 simultaneously, the fifth current spreading layer 91 being located at a side of the second active layer 90 facing away from the substrate 10;

forming, by the same one patterning process, the first compensation electrode 33, the second compensation electrode 22 and the third compensation electrode 92 simultaneously, the third compensation electrode 92 being located at a side of the fifth current spreading layer 91 facing away from the substrate 10; the insulating layer GI covering the third compensation electrode 92;

forming, by the same one patterning process, the first via hole, the second via hole, the third via hole and the fourth via hole on the insulating layer GI simultaneously, a portion of the fourth current spreading layer 95 being exposed by the third via hole, and a portion of the third compensation electrode 92 being exposed by the fourth via hole; and forming, by the same one patterning process, the second electrode 34, the second pole 23, the first gate electrode 24, the third pole 96, the fourth pole 93 and the second gate electrode 94 simultaneously, the third pole 96 being coupled to the first gate electrode 24, the third pole 96 being further coupled to the fourth current spreading layer 95 by the third via hole, and the fourth pole 93 being coupled to the third compensation electrode 92 by the fourth via hole.

After the manufacturing of the chip structure is completed, the chip structure is sliced into dies for subsequent transferring.

Specifically, the first active layer 20 and the second active layer 90 are made of the same material and in the same layer. The fifth current spreading layer 91, the second current spreading layer 32 and the third current spreading layer 21 are made of the same material and in the same layer. The third compensation electrode 92, the first compensation electrode 33 and the second compensation electrode 22 are made of the same material and in the same layer. The third pole 96, the fourth pole 93 and the second gate electrode 94, as well as the second electrode 34, the second pole 23 and the first gate electrode 24 are made of the same material and in the same layer.

In the manufacturing method provided by the above-mentioned embodiments, the micro light-emitting diode 100 and the drive transistor DTFT can be manufactured at the same time, and the process of manufacturing the chip structure can be greatly simplified to save manufacturing costs. In addition, in the chip structure provided by the above-mentioned embodiments, the field-effect transistor having a vertical structure is integrated into the chip structure including the micro light-emitting diode 100, which enables the driving circuit and the micro light-emitting diode 100 to be manufactured and transferred simultaneously, reduces the difficulty in transferring in a huge quantity and improves the transferring efficiency.

It should be noted that various embodiments in this specification is described in a progressive manner, the same and similar parts among various embodiments can be referred to each other, and each embodiment focuses on the differences from other embodiments. In particular, with regard to the method embodiment, since it is substantially similar to the product embodiment, the description thereof is relatively simple, and reference can be made to the description of the product embodiment for the relevant part.

Unless defined otherwise, technical or scientific terms used in the present disclosure shall have the ordinary meaning as understood by one of ordinary skill in the art to which the present disclosure belongs. The use of "first", "second", and the like in the present disclosure does not denote any order, quantity, or importance, but rather is used to distinguish one element from another. The word "include" or "comprise", and the like, means that the presence of an element or item preceding the word encompasses the presence of the element or item listed after the word and equivalents thereof, but does not exclude other elements or items. The terms "connect", "couple", or "link", and the like, are not limited to physical or mechanical connections, but may include electrical connections, whether direct or indirect. The terms "upper", "lower", "left", "right" and the like are used only to indicate a relative position relationship, which may change accordingly when the absolute position of the object being described changes.

It will be understood that when an element such as a layer, film, region, or substrate is referred to as being "on" or "under" another element, it can be "directly on" or "directly under" the other element or intervening elements may be present.

In the above description of embodiments, particular features, structures, materials or characteristics may be combined in any suitable manner in any one or more of the embodiments or examples.

The above description is only specific implementations of the present disclosure, but the protection scope of the present disclosure is not limited thereto. Any changes or substitutions, which can be readily conceived by a person skilled in the art who is familiar with the technical field of the present disclosure within the technology disclosed in the present disclosure, fall within the protection scope of the present disclosure. Accordingly, the protection scope of the present disclosure is set forth in the appended claims.

What is claimed is:

1. A chip structure, comprising: a substrate, a micro light-emitting diode and a drive transistor arranged on the substrate, wherein a first pole of the drive transistor is coupled to a first electrode of the micro light-emitting diode;

wherein the micro light-emitting diode comprises a plurality of film layers, the drive transistor comprises a plurality of film layers, and each of the plurality of film layers in the micro light-emitting diode is arranged in the same layer as a corresponding film layer in the drive transistor;

the plurality of film layers of the micro light-emitting diode comprises: a first current spreading layer, a light-emitting function layer, a second current spreading layer and a second electrode which are sequentially arranged in a stack on the substrate in a direction away from the substrate, the second electrode is located at a side of the second current spreading layer facing away from the substrate;

the plurality of film layers of the drive transistor comprises:

a first active layer, arranged at a side of the first current spreading layer facing away from the substrate;

a third current spreading layer, arranged at a side of the first active layer facing away from the substrate;

a second pole and a first gate electrode, arranged at a side of the third current spreading layer facing away from the substrate, wherein the second pole is coupled to the third current spreading layer, and the first gate electrode is insulated from the third current spreading layer; and the first current spreading layer further functions as the first electrode and the first pole.

2. The chip structure according to claim 1, wherein each of the first current spreading layer, the second current spreading layer, and the third current spreading layer is a heavily doped film layer.

3. The chip structure according to claim 1, wherein, the micro light-emitting diode further comprises a first compensation electrode, the first compensation electrode is located between the second current spreading layer and the second electrode, and the second electrode is coupled to the second current spreading layer by the first compensation electrode; and the drive transistor further comprises a second compensation electrode, the second compensation electrode is located between the third current spreading layer and the second pole, and the second pole is coupled to the third current spreading layer by the second compensation electrode.

4. The chip structure according to claim 1, further comprising a switching transistor, wherein the switching transistor comprises a plurality of film layers, and each of the plurality of film layers in the switching transistor is arranged in the same layer as a corresponding film layer in the drive transistor.

5. The chip structure according to claim 4, wherein the plurality of film layers of the switching transistor comprises:

a fourth current spreading layer, arranged on the substrate;

a second active layer, arranged at a side of the fourth current spreading layer facing away from the substrate;

a fifth current spreading layer, arranged at a side of the second active layer facing away from the substrate;

a third compensation electrode, arranged at a side of the fifth current spreading layer facing away from the substrate;

a third pole, arranged at a surface of the fourth current spreading layer facing away from the substrate, wherein the third pole is coupled to the first gate electrode of the drive transistor; and a fourth pole and a second gate electrode, arranged at a side of the third compensation electrode facing away from the substrate, wherein the fourth pole is coupled to the third compensation electrode, and the second gate electrode is insulated from the third compensation electrode.

6. The chip structure according to claim 5, wherein the second electrode, the second pole, the third pole and the fourth pole are made of a metal material.

7. The chip structure according to claim 1, further comprising:
a reflective layer, arranged at a side of the substrate facing away from the micro light-emitting diode.

8. A chip structure manufacturing method for manufacturing the chip structure according to claim 1, the manufacturing method comprising:
manufacturing a micro light-emitting diode and a drive transistor on a substrate, wherein a first pole of the drive transistor is coupled to a first electrode of the micro light-emitting diode.

9. The chip structure manufacturing method according to claim 8, wherein the manufacturing the micro light-emitting diode and the drive transistor comprises:
forming a first current spreading layer on the substrate, wherein the first current spreading layer further functions as the first pole and the first electrode;
forming a light-emitting function layer and a first active layer at a side of the first current spreading layer facing away from the substrate;
forming, by one patterning process, a second current spreading layer and a third current spreading layer simultaneously, wherein the second current spreading layer is located at a side of the light-emitting function layer facing away from the substrate, and the third current spreading layer is located at a side of the first active layer facing away from the substrate;
forming, by one patterning process, a first compensation electrode and a second compensation electrode simultaneously, wherein the first compensation electrode is located at a side of the second current spreading layer facing away from the substrate, and the second compensation electrode is located at a side of the third current spreading layer facing away from the substrate;
forming an insulating layer covering the first compensation electrode and the second compensation electrode, wherein a first via hole and a second via hole is formed in the insulating layer, wherein a portion of the first compensation electrode is exposed by the first via hole, and a portion of the second compensation electrode is exposed by the second via hole; and
forming, by one patterning process, a second electrode, a second pole and a first gate electrode which are located at a side of the insulating layer facing away from the substrate simultaneously, wherein the second electrode is coupled to the first compensation electrode by the first via hole, and the second pole is coupled to the second compensation electrode by the second via hole.

10. The chip structure manufacturing method according to claim 9, wherein the chip structure further comprises a switching transistor, and the switching transistor comprises a fourth current spreading layer, a second active layer, a fifth current spreading layer, a third compensation electrode, a third pole, a fourth pole and a second gate electrode, and the method further comprises:
forming, by the same one patterning process, the first current spreading layer and the fourth current spreading layer on the substrate simultaneously;
forming, by the same one patterning process, the first active layer and the second active layer simultaneously, wherein the second active layer is located at a side of the fourth current spreading layer facing away from the substrate;
forming, by the same one patterning process, the second current spreading layer, the third current spreading layer and the fifth current spreading layer simultaneously, wherein the fifth current spreading layer is located at a side of the second active layer facing away from the substrate;
forming, by the same one patterning process, the first compensation electrode, the second compensation electrode and the third compensation electrode simultaneously, wherein the third compensation electrode is located at a side of the fifth current spreading layer facing away from the substrate, and the insulating layer covers the third compensation electrode;
forming, by the same one patterning process, the first via hole, the second via hole, the third via hole and the fourth via hole on the insulating layer simultaneously, wherein a portion of the fourth current spreading layer is exposed by the third via hole, and a portion of the third compensation electrode is exposed by the fourth via hole; and
forming, by one patterning process, the second electrode, the second pole, the first gate electrode, the third pole, the fourth pole and the second gate electrode simultaneously, wherein the third pole is coupled to the first gate electrode, the third pole is further coupled to the fourth current spreading layer by the third via hole, and the fourth pole is coupled to the third compensation electrode by the fourth via hole.

11. The chip structure according to claim 1, further comprising:
a reflective layer, arranged at a side of the second current spreading layer facing away from the substrate.

12. A display device, comprising a plurality of chip structures, wherein each of the plurality of chip structures comprises a substrate, a micro light-emitting diode and a drive transistor arranged on the substrate, wherein a first pole of the drive transistor is coupled to a first electrode of the micro light-emitting diode;
wherein the display device further comprises an array substrate, the array substrate comprises: a base substrate; a first power source signal line, a second power source signal line and a plurality of storage capacitors which are arranged on the base substrate; wherein the plurality of storage capacitors is in one-to-one correspondence to the chip structure; and
the plurality of chip structures is distributed on the array substrate in an array, in each of the plurality of chip structures, a second electrode of the micro light-emitting diode is coupled to the first power source signal line, a second pole of a drive transistor is coupled to the second power source signal line, a first gate electrode of the drive transistor is coupled to a first electrode plate of a storage capacitor, and a second electrode plate of the storage capacitor is coupled to the second pole of the drive transistor.

13. The display device according to claim 12, wherein the chip structure further comprises a switching transistor, and the array substrate further comprises a plurality of gate lines and a plurality of data lines;
the plurality of gate line is arranged to be intersected with the plurality of data line;
the plurality of chip structures is divided into a plurality of rows of chip structures that is in one-to-one correspondence to the plurality of gate lines, and a second gate electrode of a switching transistor comprised by each chip structure in each row of the plurality of rows of chip structures is coupled to a corresponding gate line; and the plurality of chip structures is divided into a plurality of columns of chip structures that is in one-to-one correspondence to the plurality of data lines, and a fourth pole of a switching transistor comprised by each chip structure in each column of the plurality of columns of chip structures is coupled to a corresponding data line.

14. The display device according to claim 12, wherein the second electrode of the micro light-emitting diode is coupled to the first power source signal line by a third conductive connection portion, the second pole of the drive transistor is coupled to the second power source signal line by a first conductive connection portion, and the first gate electrode of the drive transistor is coupled to the first electrode plate of the storage capacitor by a second conductive connection portion.

15. The display device according to claim 12, wherein the micro light-emitting diode comprises a plurality of film layers, the drive transistor comprises a plurality of film layers, and each of the plurality of film layers in the micro light-emitting diode is arranged in the same layer as a corresponding film layer in the drive transistor.

16. The display device according to claim 15, wherein,
the plurality of film layers of the micro light-emitting diode comprises: a first current spreading layer, a light-emitting function layer, a second current spreading layer and a second electrode which are sequentially arranged in a stack on the substrate in a direction away from the substrate, the second electrode is located at a side of the second current spreading layer facing away from the substrate;

the plurality of film layers of the drive transistor comprises:
a first active layer, arranged at a side of the first current spreading layer facing away from the substrate;
a third current spreading layer, arranged at a side of the first active layer facing away from the substrate;
a second pole and a first gate electrode, arranged at a side of the third current spreading layer facing away from the substrate, wherein the second pole is coupled to the third current spreading layer, and the first gate electrode is insulated from the third current spreading layer; and
the first current spreading layer further functions as the first electrode and the first pole.

17. The display device according to claim 15, wherein,
the micro light-emitting diode further comprises a first compensation electrode, the first compensation electrode is located between the second current spreading layer and the second electrode, and the second electrode is coupled to the second current spreading layer by the first compensation electrode; and
the drive transistor further comprises a second compensation electrode, the second compensation electrode is located between the third current spreading layer and the second pole, and the second pole is coupled to the third current spreading layer by the second compensation electrode.

18. The display device according to claim 15, wherein each of the plurality of chip structures comprises a switching transistor, wherein the switching transistor comprises a plurality of film layers, and each of the plurality of film layers in the switching transistor is arranged in the same layer as a corresponding film layer in the drive transistor.

* * * * *